United States Patent
Han et al.

(10) Patent No.: US 11,493,581 B2
(45) Date of Patent: Nov. 8, 2022

(54) PULSE MAGNET DEVICE BASED ON MAGNETIC FLUX COMPRESSION, AND HIGH-FLUX MEASUREMENT METHOD

(71) Applicant: HUAZHONG UNIVERSITY OF SCIENCE AND TECHNOLOGY, Hubei (CN)

(72) Inventors: Xiaotao Han, Hubei (CN); Zelin Wu, Hubei (CN); Qinying Liu, Hubei (CN); Qi Chen, Hubei (CN); Quanliang Cao, Hubei (CN); Liang Li, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 17/707,963

(22) Filed: Mar. 30, 2022

(65) Prior Publication Data

US 2022/0221539 A1    Jul. 14, 2022

Related U.S. Application Data

(63) Continuation of application No. PCT/CN2020/133572, filed on Dec. 3, 2020.

(30) Foreign Application Priority Data

Jan. 20, 2020 (CN) .......................... 202010062539.5

(51) Int. Cl.
*G01R 33/381* (2006.01)
*H01F 7/20* (2006.01)
(Continued)

(52) U.S. Cl.
CPC .......... *G01R 33/381* (2013.01); *G01N 24/08* (2013.01); *G01R 33/02* (2013.01); *H01F 7/064* (2013.01);
(Continued)

(58) Field of Classification Search
CPC ...... G01R 33/381; G01R 33/02; G01N 24/08; H01F 7/064; H01F 7/202; H01F 27/2823
See application file for complete search history.

(56) References Cited

U.S. PATENT DOCUMENTS

2016/0065098 A1* 3/2016 Stipe ...................... H02N 15/00
310/90.5
2019/0115133 A1    4/2019 Clemen, Jr. et al.

FOREIGN PATENT DOCUMENTS

CN        86102580       2/1987
CN       106970427       7/2017
(Continued)

OTHER PUBLICATIONS

"International Search Report (Form PCT/ISA/210) of PCT/CN2020/133572," dated Feb. 25, 2021, pp. 1-5.
(Continued)

*Primary Examiner* — Jared Fureman
*Assistant Examiner* — Duc M Pham
(74) *Attorney, Agent, or Firm* — JCIPRNET

(57) ABSTRACT

Disclosed are a pulse magnet device based on magnetic flux compression, and a high-flux measurement method. The device includes a diamagnetic block, reinforcing plates, screw rods and a magnet coil. The diamagnetic block and the magnet coil are concentrically arranged in the axial direction; the reinforcing plates are arranged at ends of the magnet coil and the diamagnetic block and are connected by means of the screw rods. The diamagnetic block is used for inducing the induction current opposite the coil current during the discharge of the magnet coil, and for compressing the magnetic field to the area between the diamagnetic block and the magnet coil. The intensity and uniformity of the magnetic field around the magnet coil are improved by means of increasing the magnetic flux density.

18 Claims, 3 Drawing Sheets

(51) Int. Cl.
*G01N 24/08* (2006.01)
*G01R 33/02* (2006.01)
*H01F 27/28* (2006.01)
*H01F 7/06* (2006.01)

(52) U.S. Cl.
CPC ......... *H01F 7/202* (2013.01); *H01F 27/2823* (2013.01)

(56) References Cited

FOREIGN PATENT DOCUMENTS

| CN | 108254029 | | 7/2018 | |
|---|---|---|---|---|
| CN | 108918913 | | 11/2018 | |
| CN | 110873855 | | 3/2020 | |
| CN | 111009378 A | * | 4/2020 | ............. H01F 7/202 |
| CN | 212380216 U | * | 1/2021 | ............... H01F 7/20 |

OTHER PUBLICATIONS

"Written Opinion of the International Searching Authority (Form PCT/ISA/237) of PCT/CN2020/133572," dated Feb. 25, 2021, pp. 1-5.

* cited by examiner

PULSE MAGNET DEVICE BASED ON MAGNETIC FLUX COMPRESSION, AND HIGH-FLUX MEASUREMENT METHOD

CROSS-REFERENCE TO RELATED APPLICATIONS

This application is a continuation of international PCT application serial no. PCT/CN2020/133572, filed on Dec. 3, 2020, which claims the priority benefit of China application no. 202010062539.5, filed on Jan. 20, 2020. The entirety of each of the above-mentioned patent applications is hereby incorporated by reference herein and made a part of this specification.

TECHNICAL FIELD

The disclosure relates to the field of electromagnetic technology, and more particularly relates to a pulse magnet device based on magnetic flux compression and a high-flux measurement method.

DESCRIPTION OF RELATED ART

With the development of science and technology, many important scientific researches put forward higher requirements on the intensity of a pulse magnetic field. The main issue are as follows.

(1) How to increase the intensity of the magnetic field under limited energy. One of the solutions adopts multiple groups of power matching to respectively supply power to a multi-stage coil magnet, and implements an ultra-high-intensity magnetic field through the superposition of multiple coil magnetic fields, which makes the system control complex. However, to increase the intensity of the magnetic field through increasing the number of turns and layers of coils of a single-stage magnet, the impedance of the pulse magnet is significantly increased, the pulse of the discharge current is significantly reduced, and it is also difficult to implement a pulse magnet with high field intensity.

(2) How to reduce the time of the experiment. Due to the limitation of the aperture of the conventional pulse magnet, only one sample rod containing the sample can usually be placed in one experiment, and in one experiment, the magnet needs to be cooled to a suitable temperature before the next experiment can continue, and the cooling process may even take several hours. If the aperture of the magnet is enlarged, on the one hand, the energy required for a significant increase in the impedance of the magnet dramatically increases, and on the other hand, even if the aperture is enlarged, due to the uneven distribution of the magnetic field, it cannot be guaranteed that each sample is in the same magnetic field environment.

SUMMARY

Aiming at the defects of the prior art, the objective of the disclosure is to provide a magnet device with a high intensity and high uniformity magnetic field environment, which aims to solve the issues that a conventional single-stage pulse magnet can only measure a few samples at the same time and the intensity of the magnetic field is low.

The disclosure provides a pulse magnet device based on magnetic flux compression, which includes a diamagnetic block, reinforcing plates, screw rods, and a magnet coil. The diamagnetic block and the magnet coil are concentrically arranged in an axial direction. The reinforcing plates are arranged at ends of the magnet coil and the diamagnetic block and are connected by the screw rods. The diamagnetic block is used for inducing an induction current opposite to a coil current during a discharge process of the magnet coil, and for compressing a magnetic field to an area between the diamagnetic block and the magnet coil. Intensity and uniformity of the magnetic field around the magnet coil are improved by increasing a magnetic flux density.

In the embodiment of the disclosure, the magnet coil is disposed between the reinforcing plates. The diamagnetic block is concentrically disposed with the magnet coil and may be provided at a periphery or within an aperture of the magnet coil. The screw rods limit positions of the reinforcing plates and apply an axial clamping force to prevent relative displacement of the magnet coil or the diamagnetic block.

The screw rod may be made of a high intensity material and is preferably a stainless steel screw rod. The function of the screw rod is mainly used for connecting the reinforcing plates and is used for providing the clamping force to the reinforcing plates.

Further, the diamagnetic block may be made of a material with high electrical conductivity or a composite material containing a material with high electrical conductivity and is preferably composed of copper, steel, and other metal materials. The diamagnetic block is an annular cylinder or a cylinder. During the discharge process of a magnetic unit, the diamagnetic block induces the induction current opposite to the coil current, so that the magnetic field is compressed to the area formed by the diamagnetic block and the coil. Based on the principle of magnetic flux conservation, the magnetic field during the process is compressed and the magnetic flux density increases, so the intensity of the magnetic field and the uniformity of the magnetic field of a sample placement area are both significantly increased. The higher the electrical conductivity of the diamagnetic block, the greater the induction current, the better the effect of magnetic compression, and the more uniform and stronger the magnetic field of the sample placement area.

Furthermore, the diamagnetic block may be disposed within the magnet coil and coaxially and concentrically arranged with the magnet coil. The diamagnetic block may also be disposed outside the magnet coil and coaxially and concentrically arranged with the magnet coil.

When the diamagnetic block is arranged inside the aperture of the magnet coil and is an annular cylinder, the inside of the annular cylinder is tightly filled with a high intensity material cylinder, such as a stainless steel cylinder or an epoxy cylinder, to further improve the mechanical intensity of the diamagnetic block.

When the diamagnetic block is arranged outside the magnetic unit and is an annular cylinder, the outside of the annular cylinder may be coaxially and tightly connected to a high intensity material annular cylinder, such as a stainless steel annular cylinder or an epoxy material annular cylinder, to further improve the mechanical intensity of the diamagnetic block, and the thickness thereof is reasonably designed according to the actual required intensity of the diamagnetic block.

In the embodiment of the disclosure, the reinforcing plate may be made of a high intensity insulating material and is preferably an epoxy plate. The reinforcing plate is used for fixing the magnet coil and the diamagnetic block, for bearing axial and longitudinal electromagnetic stress generated by the magnet coil and the diamagnetic block during the pulse discharge process, and for reducing displacement and deformation.

Further, the magnet coil is composed of n groups of magnetic units connected in parallel, and the n groups of magnetic units are layered and reinforced by a layering and reinforcing manner to form a multi-layer multi-turn spiral coil. When the magnet coil has only one magnetic unit, the magnet coil does not need to be connected in parallel and there is no interlayer plate, which is simpler and easier to wind.

When there are multiple magnetic units, multiple magnet coils are arrayed up and down and are concentrically arranged, and the interlayer plate serves as a spacer supported. The magnetic units are in an electrical parallel relationship, so that the impedance of the entire magnet coil can be significantly reduced, and a higher intensity pulse current induces a higher intensity magnetic field. The number of interlayer plates should be configured according to the number of magnet coils. The interlayer plates are arranged between the magnet coils, and are made of high intensity insulating materials and are preferably epoxy plates.

Furthermore, the pulse magnet device further includes an interlayer plate. The interlayer plate is used for axially separating the magnet coil and for sharing an axial stress of the magnet coil to improve the structural strength. The number of interlayer plates matches the number of groups of magnetic units, and the number of interlayer plates is n−1.

In the embodiment of the disclosure, the sample placement area is an annular space enclosed between the magnet coil and the diamagnetic block, which is the sample placement area, and the number of samples is determined according to experimental requirements. A support may also be arranged in the sample placement area for supporting the magnetic unit and the diamagnetic block. The support should be a high intensity insulating material, which is preferably an epoxy material.

The disclosure also provides a method for implementing high-flux measurement based on the magnet device, which includes the following steps.

In Step 1, multiple sample rods containing samples are sequentially arranged in a middle portion of an annular cylindrical area formed by a diamagnetic block and a magnet coil, and are circumferentially symmetrical to each other.

In Step 2, a capacitor is charged by a power supply. The magnet coil is discharged after the capacitor is charged. The diamagnetic block induces an induction current opposite to a coil current during a discharge process of the magnet coil, and compresses a magnetic field to an area between the diamagnetic block and the magnet coil, thereby generating a uniform annular magnetic field.

In Step 3, physical properties of the samples in the sample rods may be set according to experiment requirements. For example, each sample is sequentially at different angles to the magnetic field. The physical properties of the samples to be explored are measured at the same time in one experiment and may be used for analysis, thereby implementing high-flux measurement of the samples.

Compared with the prior art, the above technical solution conceived by the disclosure has the following technical advantages.

The disclosure compresses the magnetic field around the coil to the space formed by the coil and the diamagnetic block by adding the diamagnetic block within the aperture or at the periphery of the coil, so the magnetic flux density is increased, thereby improving the intensity and uniformity of the magnetic field around the magnet coil and providing a good device platform base for related experiments.

Different from the circular magnetic field area of the conventional magnet, the coil and the diamagnetic block of the disclosure form the annular magnetic field area. In this way, on the one hand, the increase in the space of the annular area avoids that only one sample can be placed in the original circular magnetic field area, so that multiple samples may be arranged in one experiment. On the other hand, the consistency of the magnetic field in the symmetrical annular area facilitates the elimination of random errors in each experiment, so that high-flux measurement based on the magnet is possible.

BRIEF DESCRIPTION OF THE DRAWINGS

FIG. 4A is a magnetic field distribution diagram of a conventional magnet, and FIG. 4B is a magnetic field distribution diagram of a pulse magnet based on internal magnetic compression.

FIG. 6A is a magnetic field distribution characteristic of a conventional magnet, and FIG. 6B is a magnetic field distribution diagram of a pulse magnet based on internal magnetic compression.

Figure 1:
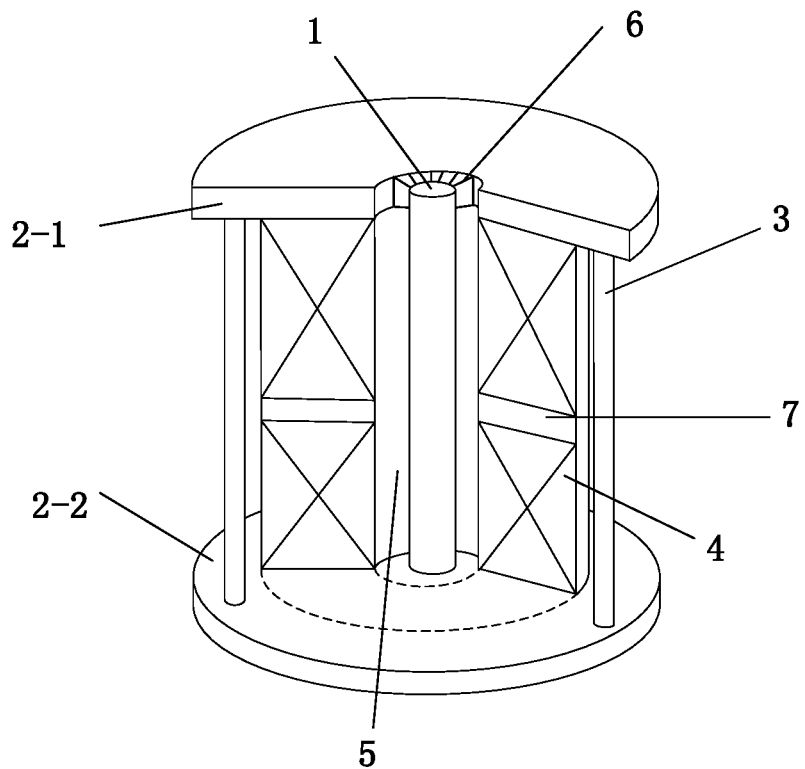
FIG. 1 is a schematic structural diagram of a high-flux magnet based on internal magnetic compression according to an embodiment of the disclosure.

Reference numerals of drawings are explained as follows: 1. diamagnetic block, 2. reinforcing plate (2-1. reinforcing plate at upper end of magnet, 2-2. reinforcing plate at lower end of magnet), 3. screw rod, 4. magnet coil, 5. sample placement area, 6. support, 7. interlayer plate.

DETAILED DESCRIPTION OF DISCLOSED EMBODIMENTS

In order for the objectives, technical solutions, and advantages of the disclosure to be clearer, the disclosure will be further described in detail below with reference to the drawings and embodiments. It should be understood that the specific embodiments described herein are only used to explain the disclosure, but not to limit the disclosure.

Based on the principle of magnetic flux compression, the disclosure proposes a magnet structure suitable for high-flux measurement, which may be used for providing a magnetic field environment with high magnetic field intensity and high uniformity for experiments such as nuclear magnetic resonance (NMR).

A pulse magnet device based on magnetic flux compression provided by the disclosure incudes a diamagnetic block, reinforcing plates, screw rods, and a magnet coil. The diamagnetic block and the magnet coil are concentrically arranged in an axial direction. The reinforcing plates are arranged at ends of the magnet coil and the diamagnetic block and are connected by the screw rods. The diamagnetic block is used for inducing an induction current opposite to a coil current during a discharge process of the magnet coil, and for compressing a magnetic field to an area between the diamagnetic block and the magnet coil. Intensity and uniformity of the magnetic field around the magnet coil are improved by increasing a magnetic flux density.

The disclosure compresses the magnetic field around the coil to the space formed by the coil and the diamagnetic block by adding the diamagnetic block within the aperture or at a periphery of the coil, so the magnetic flux density increases, thereby improving the intensity and uniformity of the magnetic field around the magnet coil and providing a good device platform base for related NMR experiments.

In the embodiment of the disclosure, the diamagnetic block may be disposed within a magnetic unit or may be disposed outside the magnetic unit. When the diamagnetic block is arranged inside the magnetic unit, the utilization rate of the magnetic field is high, and a high magnetic field intensity can be obtained, but the annular area is limited, which is only suitable for experimental requirements of measuring a small number of samples at the same time and requiring a relatively high field intensity. When the diamagnetic block is arranged outside the magnetic unit, the utilization rate of the magnetic field is relatively low, but the annular area is very large, which is suitable for experimental requirements of measuring many samples at the same time and requiring a relatively low field intensity.

In order to further illustrate the structures of the two embodiments, the following is now detailed in conjunction with the drawings.

FIG. 1 shows the structure of a high-flux magnet based on internal magnetic compression according to a first embodiment of the disclosure. A pulse magnet device based on magnetic flux compression includes a diamagnetic block 1, reinforcing plates 2, screw rods 3, and a magnet coil 4. The diamagnetic block 1 is disposed within the magnet coil 4 and is coaxially and concentrically arranged with the magnet coil 4. The reinforcing plates 2 are arranged at ends of the magnet coil 4 and the diamagnetic block 1 and are connected by the screw rods 3. The diamagnetic block 1 is used for inducing an induction current opposite to a coil current during a discharge process of the magnet coil 4, and for compressing a magnetic field to an area between the diamagnetic block 1 and the magnet coil 4. Intensity and uniformity of the magnetic field around the magnet coil 4 are improved by increasing a magnetic flux density.

As an embodiment of the disclosure, the diamagnetic block 1 may be disposed as a hollow annular copper cylindrical structure with a stainless steel cylinder embedded inside. In this way, on the one hand, the overall mechanical intensity of the diamagnetic block can be improved, and on the other hand, when the mechanical intensity is improved, the diamagnetic block is not deformed and still maintains a geometric axisymmetric property, and the consistency of the magnetic field of the sample placement area is also better. The material of the diamagnetic block 1 may be a material with high electrical conductivity, which is preferably a metal material such as copper and steel. During the discharge process of the coil, the diamagnetic block 1 induces the induction current opposite to the coil current, so that the magnetic field is compressed to the area formed by the diamagnetic block and the coil. Based on the principle of magnetic flux conservation, the magnetic field during the process is compressed and the magnetic flux density increases, so the corresponding intensity of the magnetic field and uniformity of the magnetic field are both significantly increased. The higher the electrical conductivity, the greater the induction current, and the better the effect of magnetic compression.

The reinforcing plate 2 is made of a high intensity insulating material and is preferably an epoxy plate. The reinforcing plate 2 is used for fixing the magnet coil 4 and the diamagnetic block 1, for bearing axial and longitudinal electromagnetic stress generated by the magnet coil 4 during the pulse discharge process, and for reducing displacement and deformation.

The screw rod 3 may be made of a high intensity material and is preferably a stainless steel screw rod. An upper screw rod of the screw rod 3 is connected to the upper and lower reinforcing plates. The screw rod being connected to the upper and lower reinforcing plates plays the role of fixing plate layers, and forms a mechanically stable magnet device skeleton together with the reinforcing plates 2.

A sample placement area 5 is located in an annular space surrounded by the magnet coil 4 and the diamagnetic block 1. The number of samples may be determined according to experimental requirements.

The operating principle of the high-flux magnet device based on internal magnetic compression according to the first embodiment of the disclosure will now be described in detail with reference to the drawings as follows.

Figure 3:
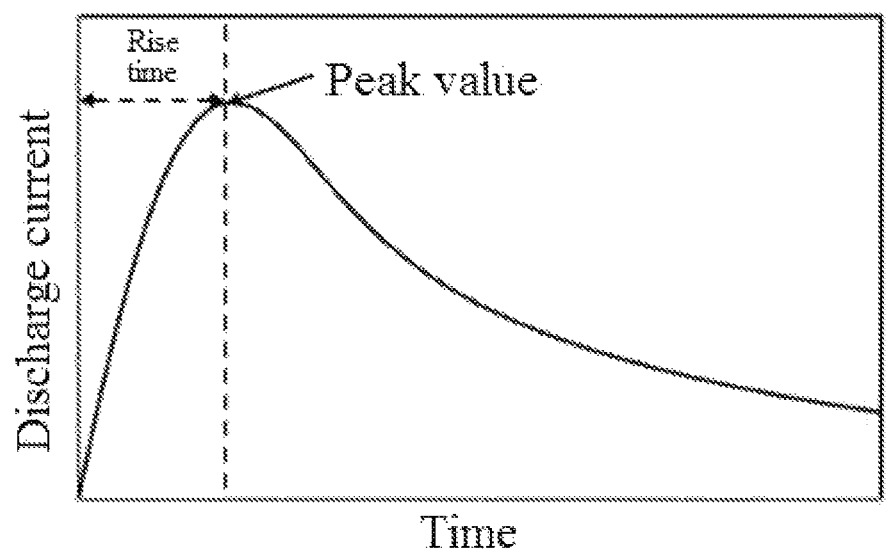
FIG. 3 is a schematic diagram of a discharge current curve of a typical pulse magnet coil.
Figure 4A:
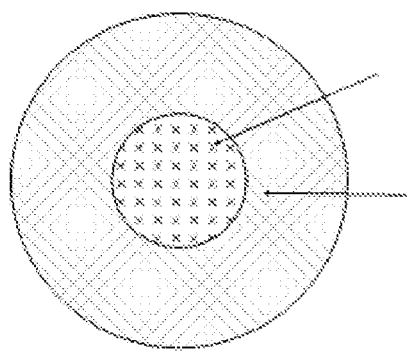
FIG. 4A and FIG. 4B are schematic diagrams of a principle of an internal magnetic compression pulse magnet; where
Figure 4B:
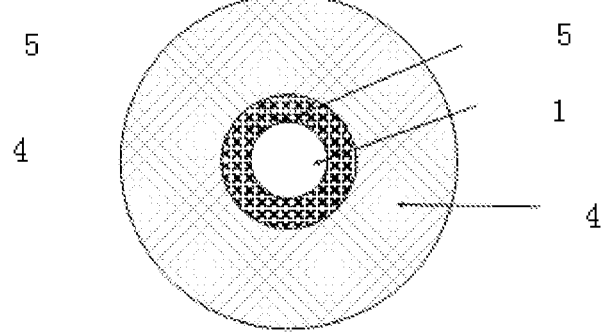

In the magnet structure device shown in FIG. 1, after the power discharge starts, a large pulse current flows into the magnet coil, and the waveform of the pulse current is shown in FIG. 3. During the rise and fall of the current, an induced magnetic field is generated around the magnet coil by Ampere's circuital law. FIG. 3 is a schematic diagram of a magnetic flux distribution of a cross section of the magnet coil, where FIG. 4A is a conventional pulse magnet without a diamagnetic block in the center of the coil; and FIG. 4B is a new magnet with a diamagnetic block arranged in the magnet coil. As shown in FIG. 4A, if the current direction is the counterclockwise direction, an outward magnetic field perpendicular to the paper surface is induced at the center of the coil, wherein the magnetic flux at the center of the axis is the densest and the intensity of the magnetic field is the highest, the magnetic flux gradually becomes sparse outward, and the intensity of the magnetic field gradually decreases radially, which affects the uniformity of the magnetic field distribution. As shown in FIG. 4B, after inserting the diamagnetic block, due to the effect of eddy currents and the skin effect, a clockwise current opposite to the direction of the solenoid current is generated on the surface of the copper block, and an opposite inward magnetic field perpendicular to the paper surface is induced. In order to satisfy the law of conservation of flux linkage, the original outward magnetic flux perpendicular to the paper surface increases and is compressed to the annular area between the coil and the copper block. By the magnetic flux equation, $\Phi=B \cdot S$; the magnetic flux $\Phi$ remains unchanged, the area S through which the magnetic flux $\Phi$ passes vertically becomes smaller, and the magnetic induction intensity B becomes greater.

Figure 2:
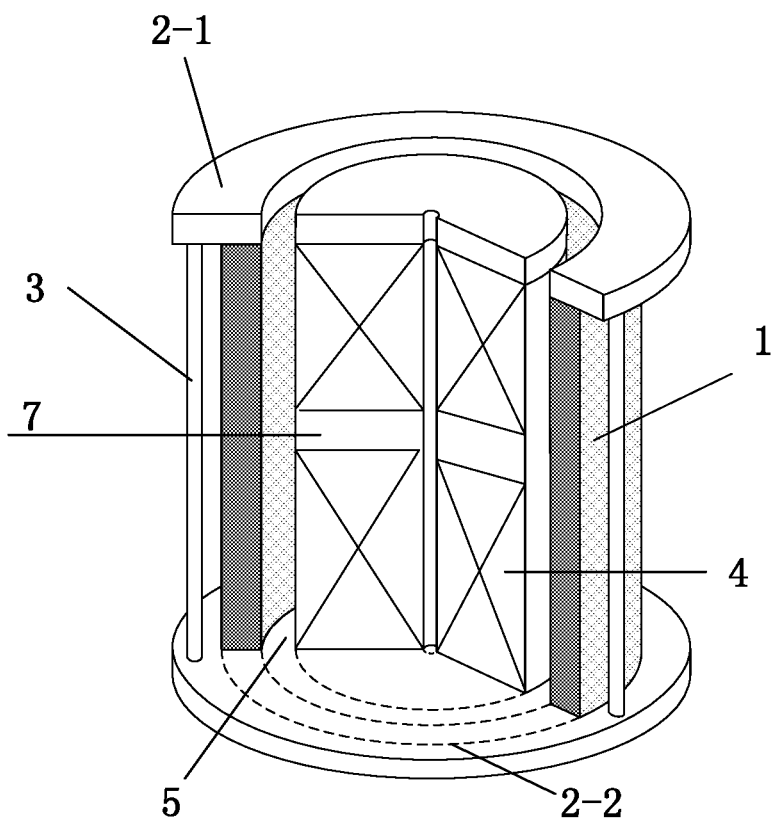
FIG. 2 is a schematic structural diagram of a high-flux magnet based on external magnetic compression according to an embodiment of the disclosure.

FIG. 2 shows a structure of a high-flux magnet based on external magnetic compression according to a second embodiment of the disclosure. A pulse magnet device based on magnetic flux compression includes a diamagnetic block 1, reinforcing plates 2, screw rods 3, and a magnet coil 4. The diamagnetic block 1 is disposed at a periphery of the magnet coil 4 and is coaxially and concentrically arranged with the magnet coil 4. The reinforcing plates 2 are arranged at ends of the magnet coil 4 and the diamagnetic block 1 and are connected by the screw rods 3. The diamagnetic block 1 is used for inducing an induction current opposite to a coil current during a discharge process of the magnet coil 4, and for compressing a magnetic field to an area between the diamagnetic block 1 and the magnet coil 4. Intensity and uniformity of the magnetic field around the magnet coil 4 are improved by increasing a magnetic flux density.

As an embodiment of the disclosure, the diamagnetic block 1 may be a hollow annular cylindrical structure and the outside is tightly connected to a stainless steel annular cylinder. In this way, on the one hand, the overall mechanical intensity of the diamagnetic block is improved, and on the other hand, when the mechanical intensity is improved, the diamagnetic block is not deformed and still maintains a geometric axisymmetric property, and the consistency of the magnetic field of the sample placement area is also better.

In the embodiment of the disclosure, the material of the diamagnetic block 1 may be a material with high electrical conductivity, which is preferably a metal material such as copper and steel. During the discharge process of the coil, the diamagnetic block 1 induces the induction current opposite to the coil current, so that the magnetic field is compressed to the area formed by the diamagnetic block and the coil. Based on the principle of magnetic flux conservation, the magnetic field during the process is compressed and the magnetic flux density increases, so the corresponding intensity of the magnetic field and uniformity of the magnetic field are both significantly increased. The higher the electrical conductivity, the greater the induction current, and the better the effect of magnetic compression.

The operating principle of the high-flux magnet device based on external magnetic compression according to the second embodiment of the disclosure will now be described in detail with reference to the drawings as follows.

Figure 6A:
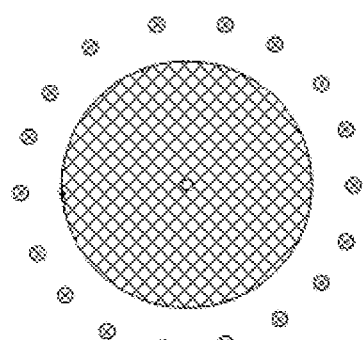
FIG. 6A and FIG. 6B are schematic diagrams of a principle of an external magnetic compression pulse magnet; where
Figure 6B:
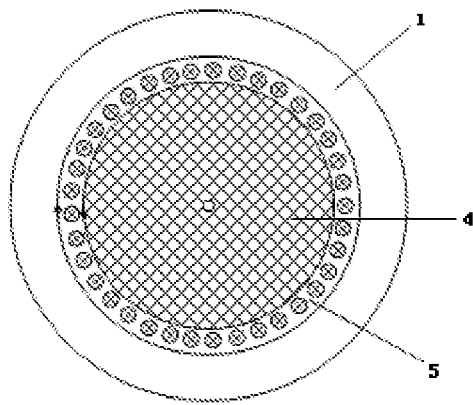

In the magnet structure device shown in FIG. 2, after the power discharge starts, a large pulse current flows into the magnet coil, and the waveform of the pulse current is shown in FIG. 3. During the rise and fall of the current, an induced magnetic field is generated around the magnet coil by Ampere's circuital law. FIG. 6A and FIG. 6B are schematic diagrams of a magnetic flux distribution of a cross section of the magnet coil, where FIG. 6A is a conventional pulse magnet without a diamagnetic block in the center of the coil; and FIG. 6B is a new magnet with a diamagnetic block arranged in the magnet coil. As shown in FIG. 6A, if the current direction is the counterclockwise direction, an outward magnetic field perpendicular to the paper surface is induced at the center of the coil, wherein the magnetic flux at the center of the axis is the densest and the intensity of the magnetic field is the highest, the magnetic flux gradually becomes sparse outward, and the intensity of the magnetic field gradually decreases radially, which affects the uniformity of the magnetic field distribution. As shown in FIG. 6B, after inserting the diamagnetic block, due to the effect of eddy currents and the skin effect, a clockwise current opposite to the direction of the solenoid current is generated on the surface of the copper block, and an opposite inward magnetic field perpendicular to the paper surface is induced. In order to satisfy the law of conservation of flux linkage, the original outward magnetic flux perpendicular to the paper surface increases and is compressed to the annular area between the coil and the copper block. It can be known from the magnetic flux equation, $\Phi = B \cdot S$, that the magnetic flux $\Phi$ remains unchanged, the area $S$ through which the magnetic flux $\Phi$ passes vertically becomes smaller, and the magnetic induction intensity $B$ becomes greater.

In the embodiment of the disclosure, the magnet coil 4 may be composed of two groups of magnetic units connected in parallel. When operating, the impedance of the magnet coil formed by the magnetic units connected in parallel is significantly reduced and is about half of that of a single-stage magnetic unit, thereby obtaining a higher intensity pulse current and inducing a higher intensity magnetic field.

As a further preference, among multiple magnetic units, the greater the number of magnetic units, the lower the impedance of the magnet coil, and the greater the intensity of the magnetic field. Compared with the single-coil structure of the conventional pulse magnet, the disclosure proposes to increase the number of coils and connect each magnetic unit in parallel to form a multi-stage coil magnet structure and increase the peak value of the pulse current, thereby increasing the peak value of the magnetic field intensity.

In the embodiment of the disclosure, the pulse magnet device further includes an interlayer plate 7. The interlayer plate 7 is arranged between multiple magnetic units and is used for axially separating the magnet coil and for sharing an axial stress of the magnet coil to further improve the structural strength.

In the embodiment of the disclosure, the magnetic unit is formed by tightly winding a wire from the inside to the outside. The wire may be a high intensity copper wire.

As an embodiment of the disclosure, the magnet coil includes two groups of magnetic units passing through the interlayer plate; and the magnet coil is in an electrical parallel relationship.

In the disclosure, the interlayer plate axially separates the magnetic unit and shares the axial stress inside the magnet coil to improve the mechanical structural strength of the entire pulse magnet device. Based on this, it is further proposed that a layering plate is used for fixing the coil between the coils connected in parallel, which can share the electromagnetic induction axial stress generated during the operating of the coils to the reinforcing plate layer. Compared with the radial reinforcing method where there is only interlayer reinforcement in the single-coil structure, the axial reinforcing measure added with the layering plate for force bearing reduces the impact of the electromagnetic force on the coil from both the horizontal and vertical directions at the same time, enhances the stability of the magnet device, and significantly improves the structural strength of the magnet.

Figure 5:
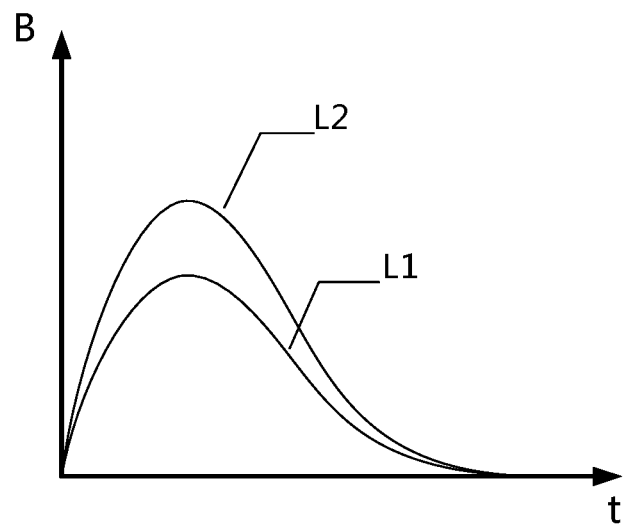
FIG. 5 is a schematic diagram of comparison between magnetic field intensity curves of a new magnet based on a principle of magnetic compression and a conventional magnet.

FIG. 5 is a simulation result diagram of an intensity distribution curve of a pulse magnetic field based on the COMSOL platform of the disclosure; where L1 is an intensity distribution curve of a conventional magnet, and L2 is an intensity distribution curve of a new magnet. It can be seen from the drawing that the new magnet provided by the embodiment of the disclosure can significantly improve the intensity of the magnetic field.

In the embodiment of the disclosure, since the original magnetic flux passing area is changed from circular to annular, the radial width is compressed, the radial decay path of the magnetic induction intensity is shortened, $\Delta B$ is reduced, and the uniformity of the magnetic field is also improved.

The pulse magnet device based on magnetic flux compression according to the embodiment of the disclosure may provide a strong magnetic field environment for NMR experiments, and the specific implementation process mainly includes the following.

(1) The magnet device skeleton includes upper and lower layers of reinforcing plates and peripheral screw rods. The peripheral screw rods are symmetrically arranged with the axis of the skeleton as the center.

(2) A high-performance conductor material (preferably a multi-layer stranded wire composite conductor material) and an interlayer reinforcing material (preferably the Zylon fiber) are selected and are densely wound on the device skeleton from the inside to the outside to form the pulse magnet. The lower end of the upper layer of coil and the upper end of the lower layer of coil are connected to form a complete current path.

(3) The sample material object to be studied and the required intensity of the magnetic field are determined. The diamagnetic block with suitable size is selected to generate the strong pulse magnetic field in the specified intensity range.

(4) A suitable sample rod is selected according to the size of the sample material. The sample rod is inserted into the annular area between the magnet coil and the copper block. For the magnet device proposed by the disclosure, multiple sample rods may be inserted into the annular area to form a circle, and an NMR measurement experiment may be performed at the same time.

(5) In the NMR experiment, when the resonance condition is satisfied, an excited nucleus undergoes an energy level transition, and the transverse magnetization vector gradually shortens. Such process is referred to as relaxation. The transverse relaxation time is closely related to the uniformity of the external magnetic field. T is used to represent the transverse relaxation time when the magnetic field is completely uniform, T' is used to represent the transverse relaxation time under a non-uniform magnetic field, γ is used to represent the nuclear magnetogyric ratio coefficient, ΔB is used to represent the amount of non-uniformity of the magnetic field, and the size of the transverse relaxation time Tis mainly determined by the amount of non-uniformity ΔB of the spatial distribution of the magnetic field.

$$T = T' + \gamma T T' \cdot \Delta B \quad (2)$$

The relative resolution ζ is the ratio of the absolute resolution of the NMR spectrometer to the operating frequency $f_0$.

$$\zeta = \frac{\Delta f}{f_0} = \frac{\Delta B}{B_0} \quad (3)$$

Where $B_0$ is the background magnetic field intensity, and $$\frac{\Delta B}{B_0}$$

is the background magnetic field uniformity. Therefore, the resolution of the NMR spectrometer depends on the uniformity of the spatial distribution of the external magnetic field. An external magnetic field with high uniformity is the premise to improving the resolution and sensitivity of the NMR experiment.

Generally, the signal and noise ratio (SNR) of an NMR signal of a standard sample measured by the spectrometer is used to define the sensitivity of the NMR experiment. The theoretical derivation result shows that the NMR detection sensitivity is related to the following factors:

$$SNR \propto \gamma \varphi Q^{\frac{1}{2}} T^{-\frac{3}{2}} b^{-\frac{1}{2}} B_0^{\frac{3}{2}}. \quad (4)$$

Where γ is the quantity related to the intrinsic atomic nucleus, ω is a quantity related to the volume of the sample and the coil, Q is the resonant tank quality factor, T is the absolute temperature, and b is the quantity related to the receiver noise bandwidth. The above equation shows that the intensity of the NMR signal is proportional to the background magnetic field intensity $$B_0^{\frac{3}{2}}.$$

The stronger the background magnetic field intensity, the higher the signal to noise ratio of the obtained NMR signal, and the higher the detection sensitivity.

FIG. 6A is a distribution characteristic of a magnetic field of a conventional magnet, and FIG. 6B is a distribution diagram of a magnetic field of a pulse magnet based on external magnetic compression. In the embodiment of the disclosure, when the diamagnetic block is arranged outside the magnet coil, the magnetic field distribution is shown in FIG. 6B. At this time, the magnetic flux around the coil is gathered and compressed, which may also achieve the objective of improving the intensity and uniformity of the magnetic field.

Persons skilled in the art can easily understand that the above are only preferred embodiments of the disclosure and are not intended to limit the disclosure. Any modifications, equivalent replacements, improvements, etc. made within the spirit and principles of the disclosure should be included within the protection scope of the disclosure.

What is claimed is:

1. A pulse magnet device based on magnetic flux compression, comprising a diamagnetic block, reinforcing plates, screw rods, and a magnet coil, wherein
the diamagnetic block and the magnet coil are concentrically arranged in an axial direction, and the reinforcing plates are arranged at ends of the magnet coil and the diamagnetic block and are connected by the screw rods;
the diamagnetic block is used for inducing an induction current opposite to a coil current during a discharge process of the magnet coil, and for compressing a magnetic field to an area between the diamagnetic block and the magnet coil; and intensity and uniformity of the magnetic field around the magnet coil are improved by increasing a magnetic flux density.

2. The pulse magnet device according to claim 1, wherein the diamagnetic block is disposed within the magnet coil and is coaxially and concentrically arranged with the magnet coil.

3. The pulse magnet device according to claim 2, wherein the diamagnetic block is a solid cylindrical structure or a hollow annular cylindrical structure.

4. The pulse magnet device according to claim 3, wherein the diamagnetic block is made of a material with high electrical conductivity.

5. The pulse magnet device according to claim 3, wherein the magnet coil is composed of n groups of magnetic units connected in parallel, and each group of the magnetic units are layered and reinforced by a layering and reinforcing manner to form a multi-layer multi-turn spiral coil, where n is an integer greater than or equal to 1;

when operating, impedance of the magnet coil connected in parallel is significantly reduced, and the magnet coil obtains a higher peak value of a pulse current, thereby obtaining a higher intensity magnetic field.

6. The pulse magnet device according to claim 2, wherein the diamagnetic block is made of a material with high electrical conductivity.

7. The pulse magnet device according to claim 2, wherein the magnet coil is composed of n groups of magnetic units connected in parallel, and each group of the magnetic units are layered and reinforced by a layering and reinforcing manner to form a multi-layer multi-turn spiral coil, where n is an integer greater than or equal to 1;
when operating, impedance of the magnet coil connected in parallel is significantly reduced, and the magnet coil obtains a higher peak value of a pulse current, thereby obtaining a higher intensity magnetic field.

8. The pulse magnet device according to claim 1, wherein the diamagnetic block is disposed outside the magnet coil and is coaxially and concentrically arranged with the magnet coil.

9. The pulse magnet device according to claim 8, wherein the diamagnetic block is a hollow annular cylindrical structure.

10. The pulse magnet device according to claim 9, wherein the diamagnetic block is made of a material with high electrical conductivity.

11. The pulse magnet device according to claim 9, wherein the magnet coil is composed of n groups of magnetic units connected in parallel, and each group of the magnetic units are layered and reinforced by a layering and reinforcing manner to form a multi-layer multi-turn spiral coil, where n is an integer greater than or equal to 1;
when operating, impedance of the magnet coil connected in parallel is significantly reduced, and the magnet coil obtains a higher peak value of a pulse current, thereby obtaining a higher intensity magnetic field.

12. The pulse magnet device according to claim 8, wherein the diamagnetic block is made of a material with high electrical conductivity.

13. The pulse magnet device according to claim 8, wherein the magnet coil is composed of n groups of magnetic units connected in parallel, and each group of the magnetic units are layered and reinforced by a layering and reinforcing manner to form a multi-layer multi-turn spiral coil, where n is an integer greater than or equal to 1;
when operating, impedance of the magnet coil connected in parallel is significantly reduced, and the magnet coil obtains a higher peak value of a pulse current, thereby obtaining a higher intensity magnetic field.

14. The pulse magnet device according to claim 1, wherein the diamagnetic block is made of a material with high electrical conductivity.

15. The pulse magnet device according to claim 1, wherein the magnet coil is composed of n groups of magnetic units connected in parallel, and each group of the magnetic units are layered and reinforced by a layering and reinforcing manner to form a multi-layer multi-turn spiral coil, where n is an integer greater than or equal to 1;
when operating, impedance of the magnet coil connected in parallel is significantly reduced, and the magnet coil obtains a higher peak value of a pulse current, thereby obtaining a higher intensity magnetic field.

16. The pulse magnet device according to claim 15, wherein the pulse magnet device further comprises: an interlayer plate, wherein
the interlayer plate is disposed between the magnetic units and is used for axially separating the magnet coil and for sharing an axial stress of the magnet coil to improve structural strength.

17. The pulse magnet device according to claim 16, wherein a number of the interlayer plate matches a number of groups of the magnetic units, and the number of the interlayer plate is n−1.

18. A high-flux measurement method implemented based on the pulse magnet device according to claim 1, comprising:
sequentially arranging a plurality of sample rods containing samples in a middle portion of an annular cylindrical area formed by the diamagnetic block and the magnet coil, wherein the sample rods are circumferentially symmetrical to each other; setting physical properties of the samples in the sample rods according to requirements;
discharging the magnet coil by a capacitor, inducing the induction current opposite to the coil current during the discharge process of the magnet coil, compressing the magnetic field to the annular cylindrical area formed by the diamagnetic block and the magnet coil, and generating a uniform annular magnetic field by the diamagnetic block; measuring the physical properties of the samples to be explored at the same time in one discharge experiment, thereby implementing high-flux measurement of the samples.

* * * * *